US008659057B2

(12) United States Patent
Ritenour et al.

(10) Patent No.: US 8,659,057 B2
(45) Date of Patent: Feb. 25, 2014

(54) SELF-ALIGNED SEMICONDUCTOR DEVICES WITH REDUCED GATE-SOURCE LEAKAGE UNDER REVERSE BIAS AND METHODS OF MAKING

(75) Inventors: Andrew Ritenour, Colfax, NC (US); David C. Sheridan, Starkville, MS (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/112,075

(22) Filed: May 20, 2011

(65) Prior Publication Data

US 2011/0291107 A1 Dec. 1, 2011

Related U.S. Application Data

(60) Provisional application No. 61/347,928, filed on May 25, 2010.

(51) Int. Cl.
*H01L 29/15* (2006.01)
*H01L 31/0312* (2006.01)

(52) U.S. Cl.
USPC 257/263; 257/77; 257/E21.447; 257/E29.084; 257/E29.313

(58) Field of Classification Search
USPC .......................................... 257/263; 438/192
See application file for complete search history.

(56) References Cited

U.S. PATENT DOCUMENTS

| 2,984,752 | A | 5/1961 | Giacoletto |
| 4,216,490 | A | 8/1980 | Ohki |
| 4,262,296 | A | 4/1981 | Shealy et al. |
| 4,364,072 | A | 12/1982 | Nishizawa |
| 4,403,396 | A | 9/1983 | Stein |
| 4,587,540 | A | 5/1986 | Jackson |
| 4,952,990 | A | * 8/1990 | Gruning ........................ 257/263 |
| 5,429,956 | A | 7/1995 | Shell et al. |
| 5,747,831 | A | 5/1998 | Loose et al. |
| 5,903,020 | A | 5/1999 | Siergiej et al. |
| 5,945,701 | A | 8/1999 | Siergiej et al. |
| 6,444,527 | B1 | 9/2002 | Floyd et al. |
| 6,917,054 | B2 | 7/2005 | Onose et al. |
| 7,187,021 | B2 | 3/2007 | Mitra et al. |
| 7,479,672 | B2 | 1/2009 | Zhao |
| 7,763,506 | B2 | 7/2010 | Treu et al. |
| 8,058,655 | B2 | 11/2011 | Sheridan et al. |

(Continued)

FOREIGN PATENT DOCUMENTS

CN 101103464 A 1/2008

OTHER PUBLICATIONS

Nishizawa, et al., "The 2.45 GHz 36 W CW Si Recessed Gate Type SIT with High Gain and High Voltage Operation" IEEE Trans. Electron Devices, vol. 4, p. 482-487, (2000).

(Continued)

*Primary Examiner* — Fernando L Toledo
*Assistant Examiner* — Valerie N Newton

(57) ABSTRACT

A vertical junction field effect transistor (VJFET) having a self-aligned pin, a p+/n/n+ or a p+/p/n+ gate-source junction is described. The device gate can be self-aligned to within 0.5 μm to the source in order to maintain good high voltage performance (i.e. low DIBL) while reducing gate-source junction leakage under reverse bias. The device can be a wide-bandgap semiconductor device such as a SiC vertical channel junction field effect. Methods of making the device are also described.

20 Claims, 13 Drawing Sheets

(56) References Cited

U.S. PATENT DOCUMENTS

| | | | |
|---|---|---|---|
| 2002/0117481 | A1 | 8/2002 | Unrath et al. |
| 2002/0146886 | A1 | 10/2002 | Chern |
| 2003/0025147 | A1 | 2/2003 | Nomoto et al. |
| 2004/0113207 | A1 | 6/2004 | Hsu et al. |
| 2005/0181536 | A1 | 8/2005 | Tsuji |
| 2006/0199312 | A1 | 9/2006 | Harris et al. |
| 2006/0226504 | A1 | 10/2006 | Hatakeyama et al. |
| 2007/0029573 | A1 | 2/2007 | Cheng et al. |
| 2007/0058418 | A1 | 3/2007 | Kihara |
| 2007/0096145 | A1 | 5/2007 | Watanabe |
| 2007/0148939 | A1 | 6/2007 | Chu et al. |
| 2007/0187715 | A1 | 8/2007 | Zhao |
| 2007/0278540 | A1 | 12/2007 | Hoshino et al. |
| 2008/0173936 | A1 | 7/2008 | Yoon et al. |
| 2008/0280412 | A1 | 11/2008 | Tsuji |
| 2009/0068803 | A1* | 3/2009 | Treu et al. .................. 438/192 |
| 2009/0278137 | A1 | 11/2009 | Sheridan et al. |
| 2009/0278177 | A1* | 11/2009 | Sankin et al. ................ 257/272 |
| 2010/0148224 | A1 | 6/2010 | Zhao |

OTHER PUBLICATIONS

Von Munch, et al., "Thermal Oxidation and Electrolytic Etching of Silicon Carbide" J. Electrochemical Soc., vol. 122, p. 642-643 (1974).

International Search Report dated Dec. 28, 2011.

I. Sankin, "Edge termination and RESURF technology in power silicon carbide devices," Ph.D. Dissertation, Mississippi State University, 2006, AAT 3213969, pp. 106-111.

I. Sankin, et al., "Power SiC MOSFETs," Advances in Silicon Carbide Processing and Applications, Book Chapter, S. E. Saddow and A. Agrawal, Editors, p. 158.

J.H. Zhao, et al., "3.6 mO•cm2, 1726V 4H-SiC normally-off trenched-and-implanted vertical JFETs and circuit applications," IEE Proc.—Circuits Devices Syst., vol. 151, No. 3, Jun. 2004.

J.N. Merrett, et al., "RF and DC characterization of Self-aligned L-band 4H-SiC Static Induction Transistors", Materials Science Forum, vols. 527-529, 2006, pp. 1223-1226.

Legacy CACE User's Guide AixRecipe, Recipe Language for AIXTRON systems, Copyright 1994-2004, AIXTRON AG, Kaskertstrasse 15-17 D-52072 Aashen, Germany.

M. Nagata, et al., "A short-channel, punch-through-breakdown-free MOS transistor," International Electron Devices Meeting, vol. 17, 1971, pp. 2-3.

P. Sannuti, et al., "Channel electron mobility in 4H-SiC lateral junction field effect transitors," Solid-Slate Electronics, 49, 2005, pp. 1900-1904.

W. Shockley, "A Unipolar "Field-Effect" Transistor," Proceedings of the IRE, vol. 40, Issue 11, Nov. 1952, pp. 1365-1376.

X. Li, et al., "Gate-Controlled Punch Through Transistor," Department of Electrical Engineering, University of Idaho.

* cited by examiner

SELF-ALIGNED SEMICONDUCTOR DEVICES WITH REDUCED GATE-SOURCE LEAKAGE UNDER REVERSE BIAS AND METHODS OF MAKING

CROSS-REFERENCE TO RELATED APPLICATIONS

This application claims the benefit of Provisional U.S. Patent Application Ser. No. 61/347,928, filed May 25, 2010, pending, which is incorporated by reference herein in its entirety.

The section headings used herein are for organizational purposes only and should not be construed as limiting the subject matter described herein in any way.

BACKGROUND

1. Field

This application relates generally to semiconductor devices and methods of making the devices and, in particular, to wide-bandgap semiconductor devices such as SiC vertical channel junction field effect transistors with reduced gate-source leakage under reverse bias.

2. Background of the Technology

To date, vertical channel silicon carbide junction field effect transistors have been proposed as devices with vertical or near vertical sidewalls [1, 2]. In devices with vertical or near vertical sidewalls, however, it can be difficult to achieve uniform p+ sidewall doping using ion implantation. In particular, normal incident ion implantation can result in non-uniformly doped sidewalls having a low dopant concentration.

The use of angled ion implantation to dope the sidewalls has been disclosed [1, 3]. Even with this approach, however, it is difficult to achieve an idealized structure having uniform channel width ($w_{ch}$). In particular, the use of an angled implantation can still result in heavier doping near the trench bottom and non-uniform doping along the sidewall which reduces device performance. Furthermore, to insure similar doping on both sidewalls the wafer has to be rotated during implantation. For SiC, however, ion implantation requires multiple implants at different energies. Therefore, a process involving rotation of the wafer and angled implantation can add significantly to the complexity and cost of the manufacturing process.

Accordingly, there still exists a need for improved methods of making semiconductor devices such as vertical JFETs with more uniform and well-controlled channel width.

SUMMARY

A semiconductor device is provided which comprises:
a substrate layer of a semiconductor material of a first conductivity type;
a channel layer of a semiconductor material of the first conductivity type on an upper surface of the substrate layer, the channel layer comprising a lower surface and one or more raised regions comprising an upper surface and first and second sidewalls, wherein the first and second sidewalls of the raised regions adjacent the lower surface are tapered inward and form an angle of at least 5° from vertical to the upper surface of the substrate layer, wherein the one or more raised regions comprises an inner portion of a semiconductor material of the first conductivity type and outer portions of a semiconductor material of a second conductivity type different than the first conductivity type, wherein the outer portions are adjacent to the first and second sidewalls;
gate regions of semiconductor material of the second conductivity type in the lower surface of the channel layer adjacent to and contiguous with the outer portions of adjacent raised regions; and
a source layer of a semiconductor material of the first conductivity type on the upper surfaces of the one or more raised regions;
wherein the outer portions of the raised regions are offset from the source layer such that the outer portions of the raised regions do not contact the source layer.

A method is also provided which comprises:
selectively implanting ions into a channel layer of a semiconductor material of a first conductivity type to form implanted gate regions of semiconductor material of a second conductivity type different than the first conductivity type, wherein the channel layer is on an upper surface of a substrate layer and wherein the channel layer comprises a lower surface and one or more raised regions comprising an upper surface and first and second sidewalls, wherein the first and second sidewalls of the raised regions adjacent the lower surface are tapered inward and form an angle of at least 5° from vertical to the upper surface of the substrate, wherein source regions of a semiconductor material of the first conductivity type are on the upper surfaces of the one or more raised regions, the source regions comprising side surfaces adjacent the first and second sidewalls and an upper surface and an implant mask is on the upper surface of the source regions, wherein the implanted gate regions are formed in the sidewalls and in the lower surface of the channel layer and wherein the implanted gate regions are offset from the upper surface of the raised regions; and
removing the implant mask;
wherein the implanted gate regions on the sidewalls are offset from the source layer such that the implanted gate regions on the sidewalls do not contact the source layer.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

A power junction field effect transistor (JFET) should remain in the off-state even with very large biases applied to the drain terminal (e.g., 600 V-10 kV). Accordingly, the power JFET device should have a minimal "drain-induced barrier lowering" (commonly referred to as "DIBL"). In the DIBL phenomenon, the applied drain voltage lowers the energy barrier between the source and drain, thus allowing undesirable leakage current to flow through the device.

To minimize the DIBL effect and thus enable the power transistor to block large voltages (e.g., 600 V-10 kV), the off-state energy barrier should occur near the source electrode and there should be a "long channel" separating the drain from the source. In effect, the energy barrier (which is modulated by the bias applied to the p+ gate) should be as far away from the drain as possible to minimize DIBL. This is accomplished by locating the narrowest part of the channel near the source, as is the case with a JFET that has sloped sidewalls as disclosed in U.S. patent application Ser. No. 12/613,065 or by a device having a non-uniform channel doping profile in which the doping concentration near the source is lower than the rest of the channel as disclosed in U.S. patent application Ser. No. 12/117,121.

Since the energy barrier should be very close to the source and should be modulated by the gate in order to control conduction through the device, the p+ gate should necessarily be located in very close proximity to the n+ source. The process by which the p+ gate is formed should also be self-aligned to the channel/finger. This is the case when a SiC vertical JFET is formed by etching a finger and implanting the p+ gate using the same mask. Other SiC vertical transistors such as the static induction transistor (SIT) are not designed to block large drain voltages, therefore the channel design requirements are less stringent and structures with a large, non-self-aligned separation between n+ source and p+ gate are permitted.

Figure 1A:
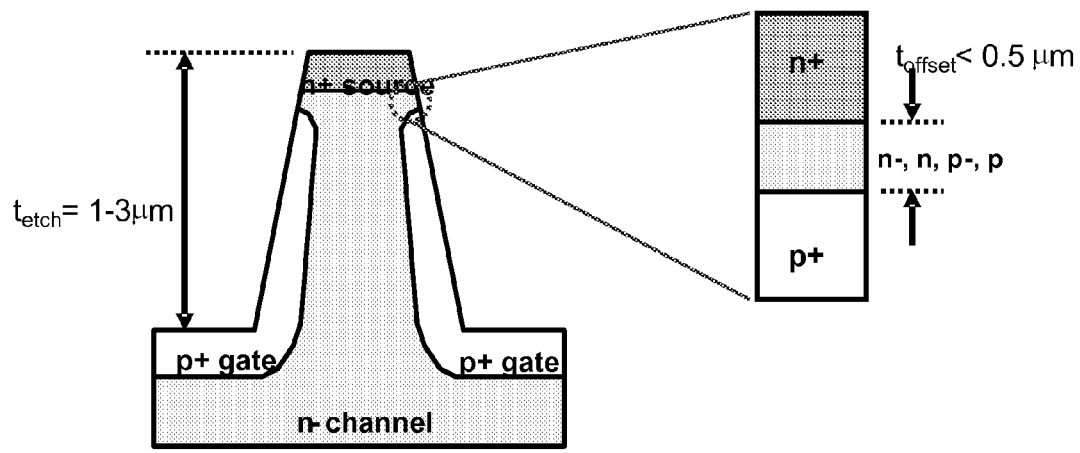
FIG. 1A is a schematic of a vertical junction field effect transistor having sloped sidewalls wherein the n+ source region is offset 0.5 μm or less from the p+ implanted gate region by a n, n−, p− or p region.
Figure 1B:
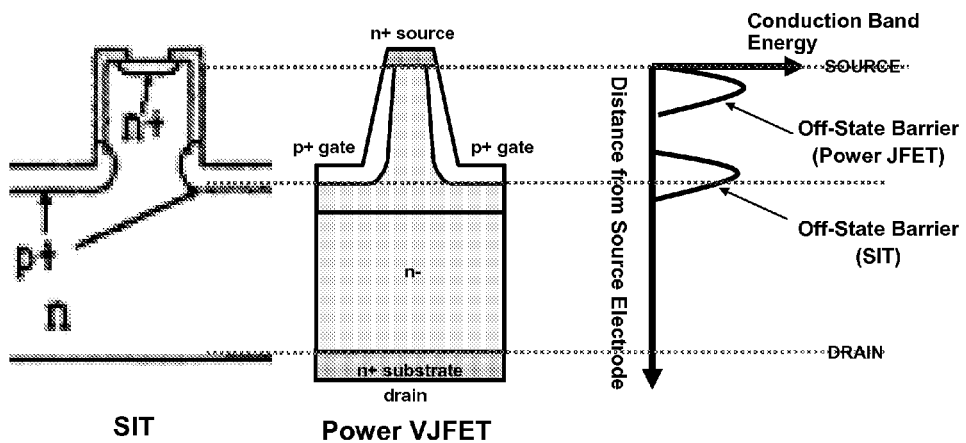
FIG. 1B illustrates the conduction band energy as a function of the distance from the source electrode for an SIT device and a power VJFET device.

SIT structures typically have the off-state barrier much closer to the drain terminal and typically have shorter channels (for high frequency operation) than a power JFET as shown in FIG. 1B. See, for example, Nishizawa et al., IEEE Trans. Electron Devices, Vol. 4 (2000), pg. 482. Both of these features make the SIT unsuitable for high voltage (e.g., 600 V-10 kV) applications. By design, a high voltage power JFET will be more effective at blocking high voltages if the off-state barrier is located close to the source terminal as shown in FIG. 1B.

Figure 1C:
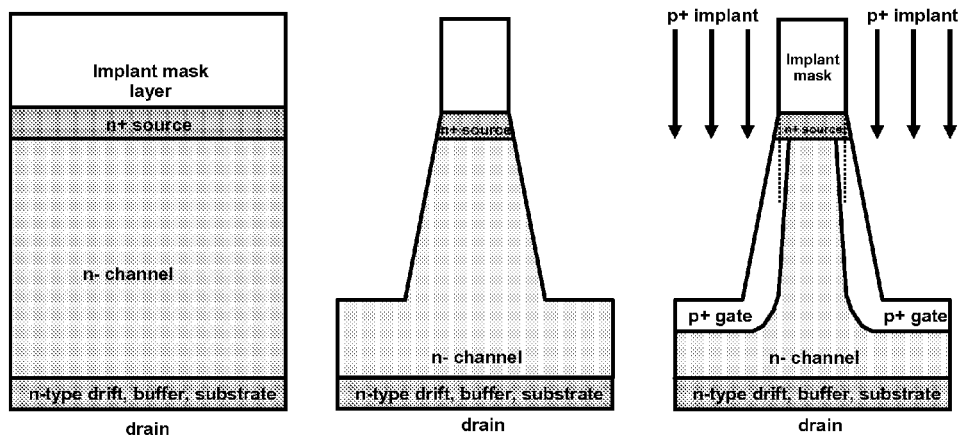
FIG. 1C is a schematic illustrating a method of making VJFET device having sloped sidewalls.

As described in U.S. patent application Ser. No. 12/613,065, which is incorporated by reference herein in its entirety, a device having sloped sidewalls can be made by depositing an implant mask layer (e.g., $SiO_2$) on an epitaxially grown SiC layer structure, patterning and etching the implant mask layer and the SiC fingers and implanting the self-aligned p+ gate regions using the implant mask. This process is illustrated in FIG. 1C. As can be seen from FIG. 1C, the implant mask in this process does not completely cover the n+ region. Lateral implant straggle may also result in implanted species extending under the implant mask. Both of these effects can result in a p+/n+ gate-source junction.

Figure 1D:
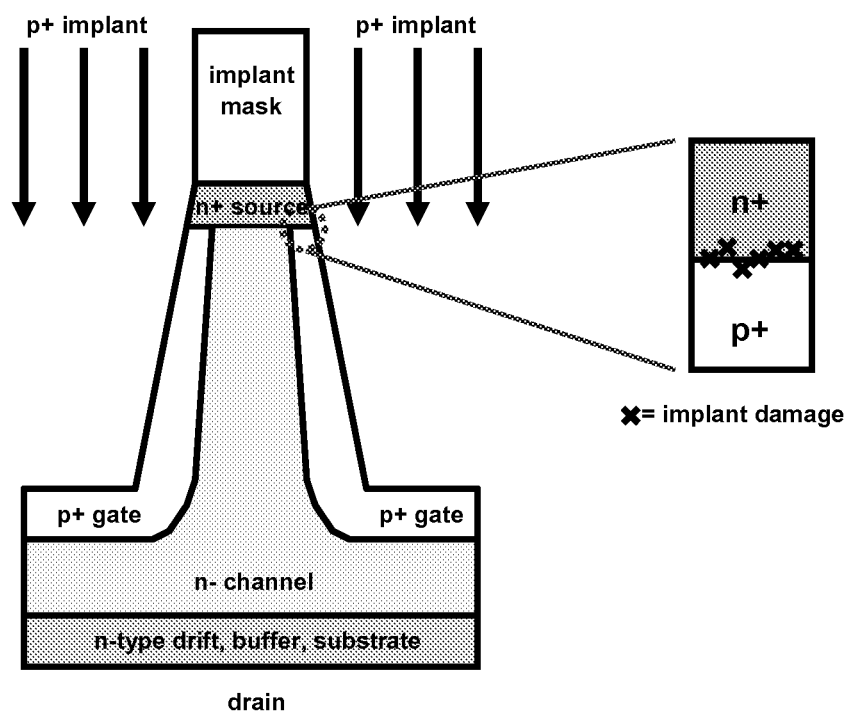
FIG. 1D is a schematic illustrating residual lattice implant damage at the p+/n+ gate-source junction of a device manufactured according to the method depicted in FIG. 1C.

As described above, a high voltage power JFET should have a long channel with gate-modulated electron barrier close to source. For the implanted gate vertical JFET, this may result in a p+/n+ gate-source junction as shown in FIG. 1C. However, a p+/n+ junction will have high leakage when a reverse bias is applied to the gate (e.g., $V_{gs}$=−15 V) to turn off the device. This can result in an undesirable static power dissipation during the off-state. High doping on both sides of the junction results in a narrow depletion region, and hence, a high electric field under reverse voltage bias which results in undesirable gate-source junction leakage. A PiN (or p+/n/n+, p+/p/n+) junction would result in a reduced electric field and hence lower leakage. Also because the junction receives a large implant dose during the p+ gate formation, residual lattice damage that is not removed during the implant activation process will may lead to enhanced generation-recombination leakage current during reverse bias. Implant damage at the p+/n+ gate-source junction is shown in FIG. 1D.

Figure 1E:
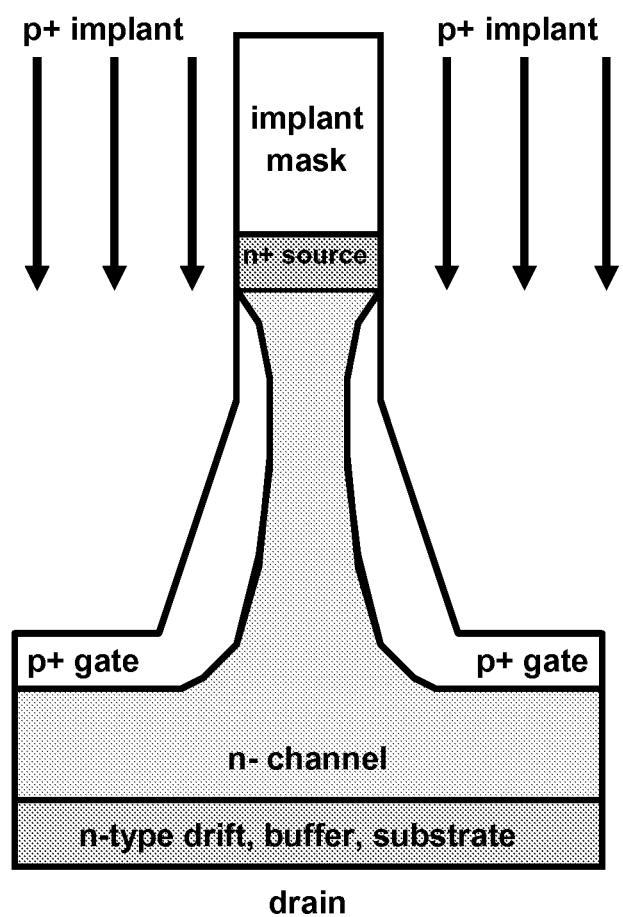
FIG. 1E is a schematic illustrating the minimization of the p+/n+ gate-source junction in a device manufactured according to the method depicted in FIG. 1C using zero degree implantation.

However, multi-slope devices with zero degree implant as described in U.S. patent application Ser. No. 12/613,065 minimize the p+/n+ junction problem because the implant mask prevents a heavy p+ dose from being implanted at the edge of the n+ region as shown in FIG. 1E. In contrast, the use of tilted or angled implantation in devices with vertical sidewalls results in high doping on both sides of the gate-source junction.

Vertical junction field effect transistors are provided having self-aligned pin (or p+/n/n+, p+/p/n+) gate-source junctions. The p+ gate can be self-aligned to within 0.5 μm of the n+ source in order to maintain good high voltage performance (i.e. low DIBL) while reducing gate-source junction leakage under reverse bias. The p+ implant region can be offset from the n+ source either during the implant or afterwards through additional post-implant processing. According to some embodiments, the p+ and n+ regions have peak doping concentration greater than $1 \times 10^{19}$ $cm^{-3}$ to minimize contact resistance. According to some embodiments, the region between the n+ and p+ regions has lower doping (n−, n, p−, or p) of less than $1 \times 10^{19}$ $cm^{-3}$.

Both the device structure and methods for fabricating the structure are provided. The methods are applicable to the manufacture of vertical, single-slope, or multi-slope VJFET fingers with both tilted and zero degree gate implantation.

The p+ implant region can be offset from n+ source by either a self-aligned mask layer during ion implantation or by the self-aligned recessing of n+ source layer after ion implantation. A VJFET device is shown in FIG. 1A. As shown in FIG. 1A, the n+ source is offset from the p+ implanted gate regions by a distance of 0.5 μm or less.

Figure 2:
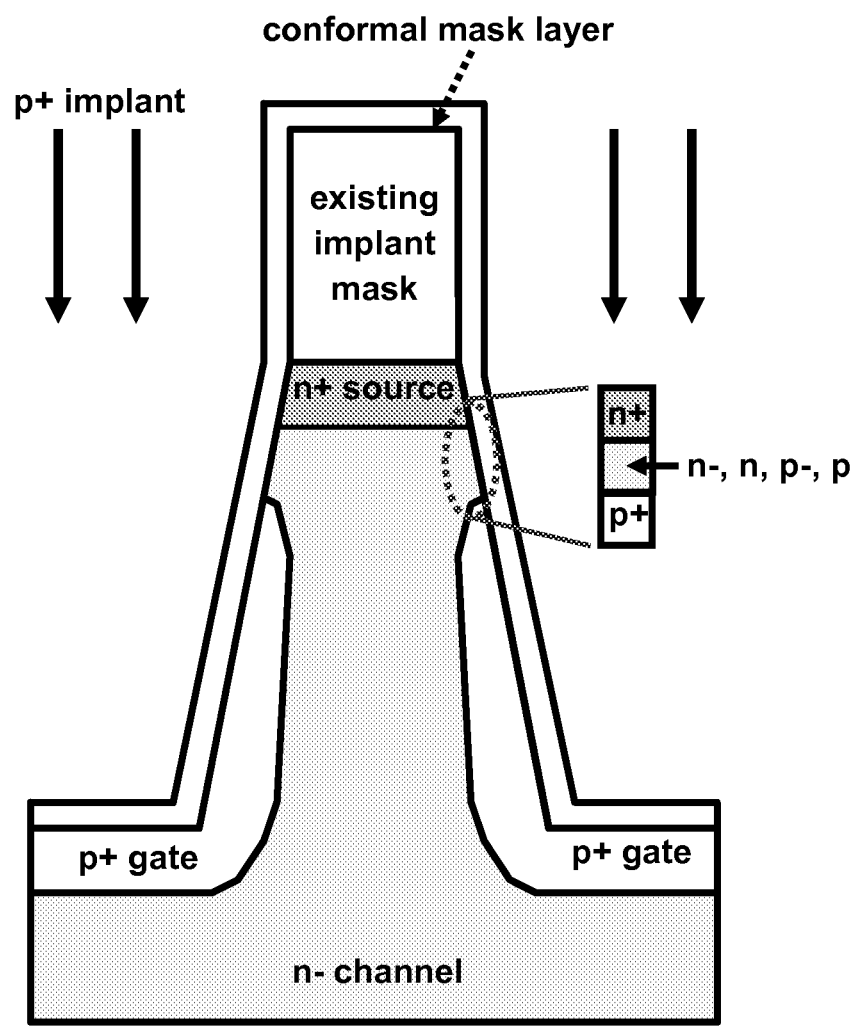
FIG. 2 is a schematic illustrating a method of making a device as set forth in FIG. 1A using a conformal mask layer.

According to a first embodiment, conformal deposition of an implant blocking layer (e.g., SiO₂) over an existing implant mask can be used to offset the implanted gate regions from the source regions. This method is illustrated in FIG. 2. As shown in FIG. 2, the n+ source is offset from the p+ implanted gate regions by an n−, n, p− or p region.

Figure 3A:
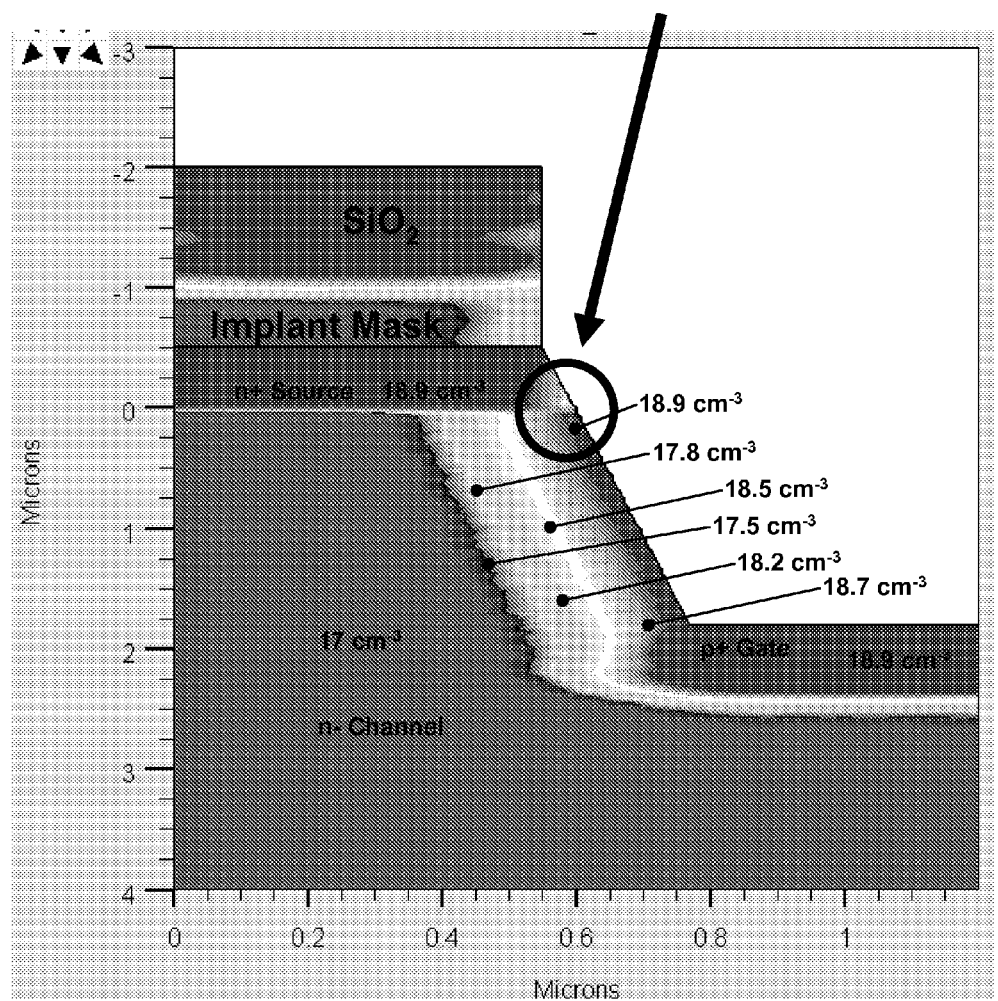
FIG. 3A illustrates the doping profile for a device having a p+/n+ junction.
Figure 3B:
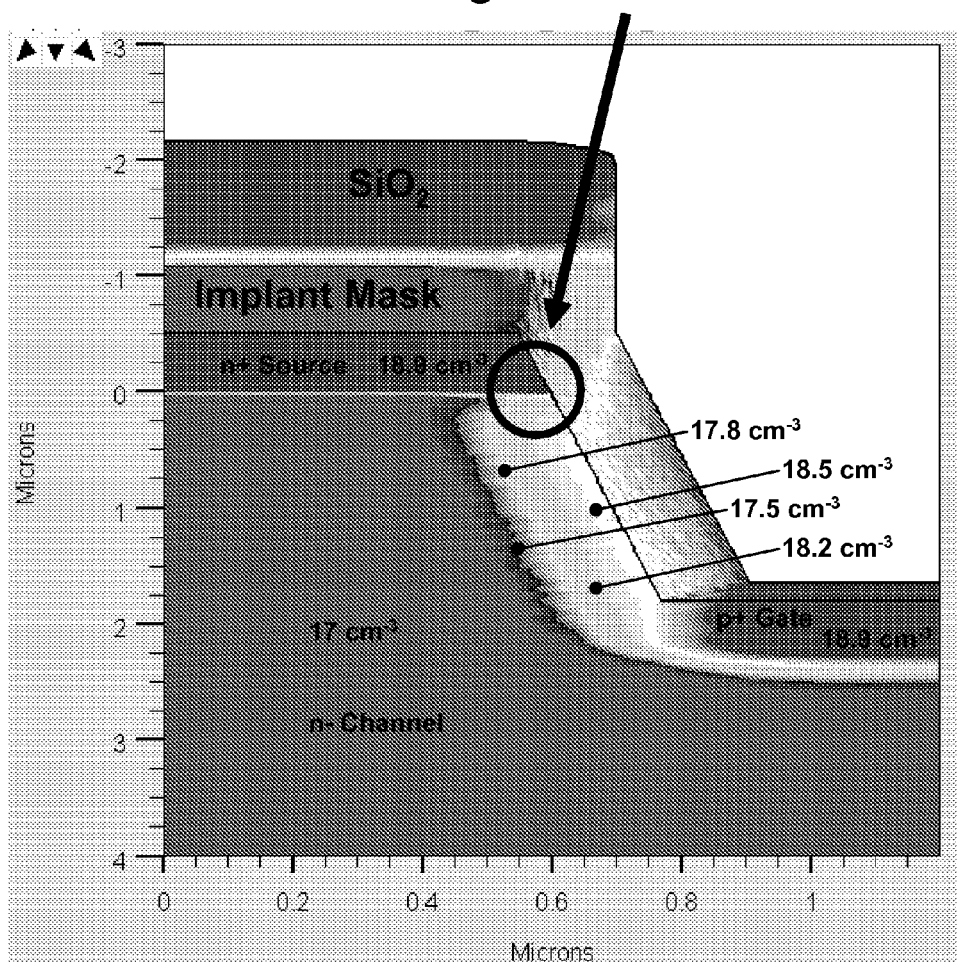
FIG. 3B illustrates the doping profile for a device having a p+/p/n+ junction made using a conformal mask showing reduced electric field and less implant damage.

FIG. 3A illustrates the doping profile for a device having a p+/n+ junction. FIG. 3B illustrates the doping profile for a device having a p+/p/n+ junction which was made using a conformal mask as set forth in FIG. 2. As can be seen from FIG. 3B, the device shows reduced electric field and less implant damage than the device of FIG. 3A. The approximate dopant concentrations are shown in FIGS. 3A and 3B.

Figure 4:
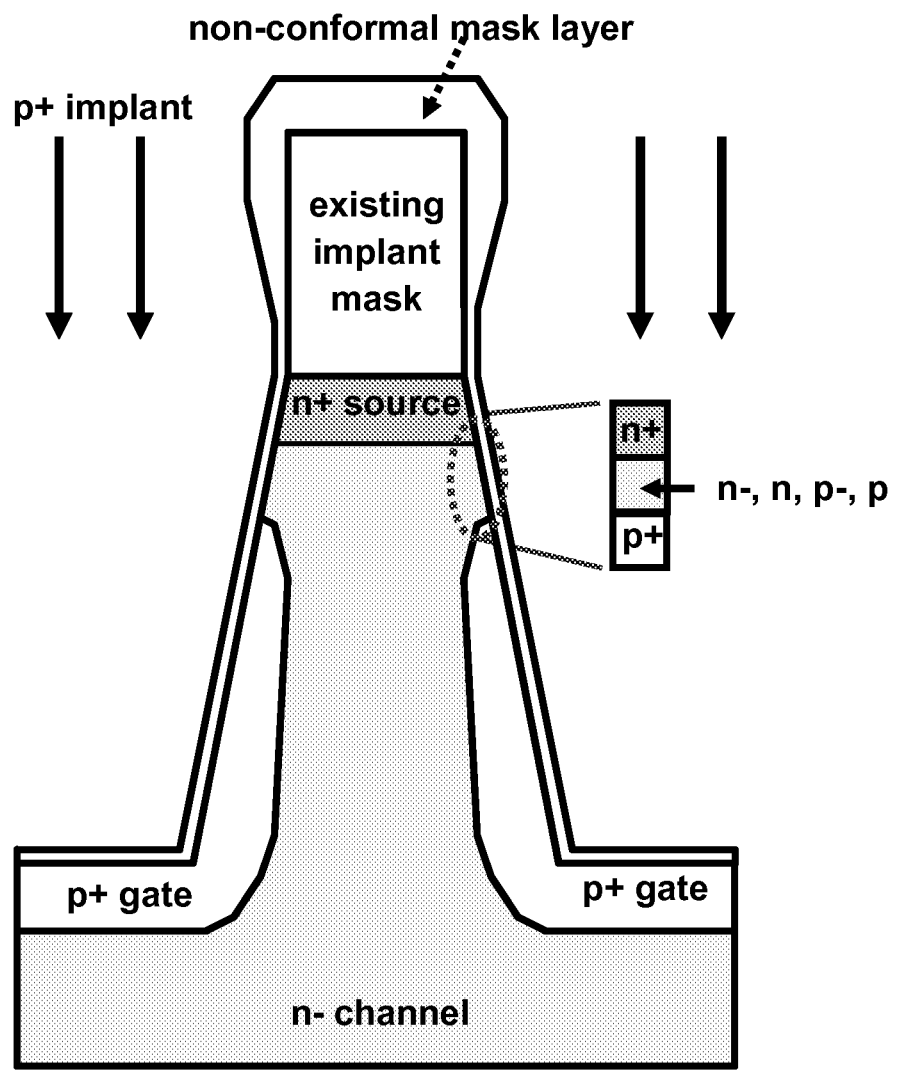
FIG. 4 is a schematic illustrating a method of making a device as set forth in FIG. 1A using a non-conformal mask layer.

According to some embodiments, the p+ implanted gate regions can be offset from the n+ source regions using a non-conformal deposition of an implant blocking layer (e.g., SiO₂) over existing an implant mask. This method is illustrated in FIG. 4. As shown in FIG. 4, the non-conformal mask layer is thicker on the sides of the implant mask than on the sidewalls of the raised channel regions.

Figure 5:
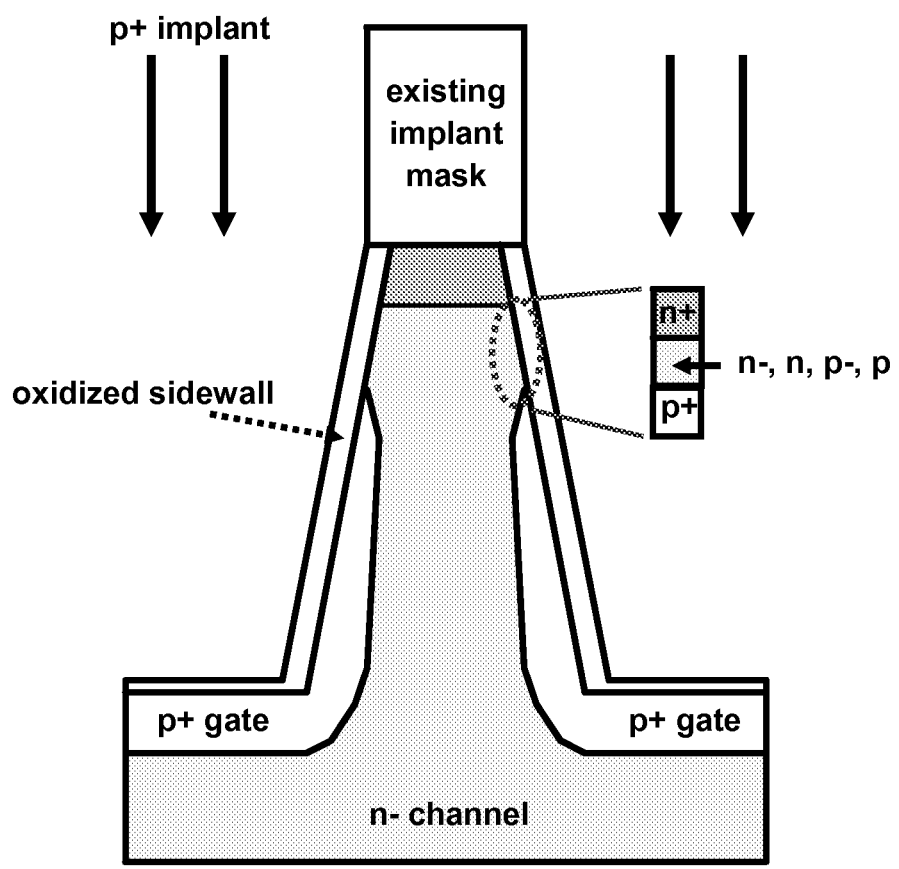
FIG. 5 is a schematic illustrating a method of making a device as set forth in FIG. 1A using thermal oxidation of the sidewall prior to sidewall implantation.

According to a some embodiments, the p+ implanted gate regions can be offset from the n+ source regions by the formation of an implant blocking layer (e.g., SiO₂) on the sidewalls using thermal oxidation prior to implantation. This method is illustrated in FIG. 5.

Figure 6:
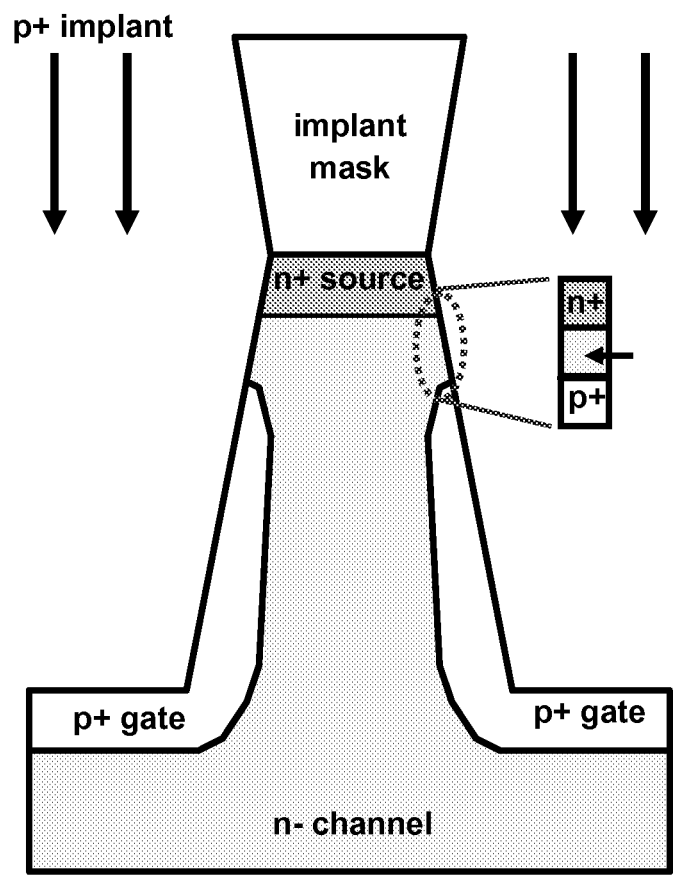
FIG. 6 is a schematic illustrating a method of making a device as set forth in FIG. 1A using an implant mask that overhangs the sidewalls.

According to some embodiments, the p+ implanted gate regions can be offset from the n+ source regions by using SiO₂ and SiC etch processes to form implant mask that overhangs finger sidewall. This method is illustrated in FIG. 6.

Figure 7:
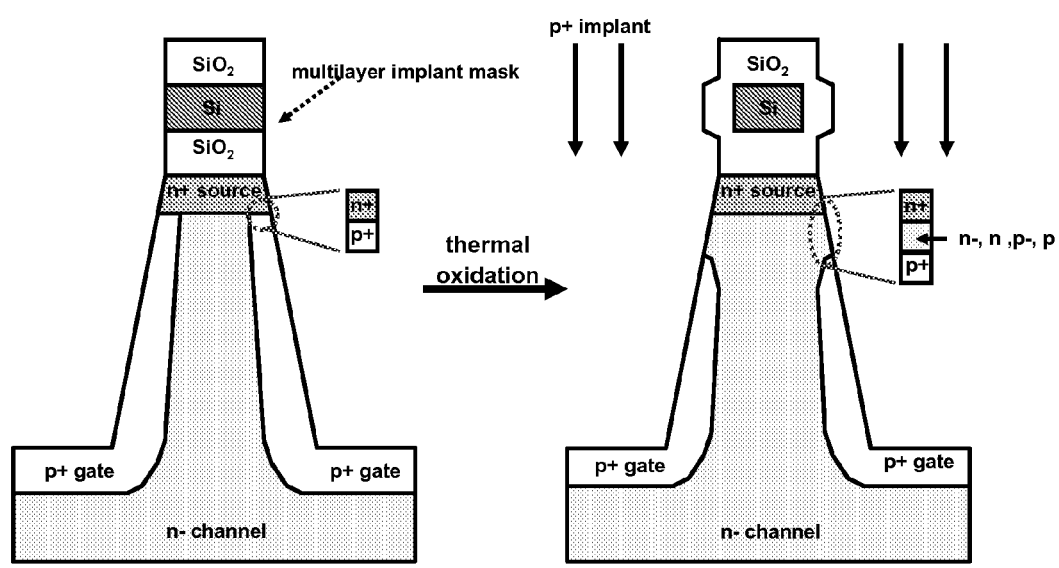
FIG. 7 is a schematic illustrating a method of making a device as set forth in FIG. 1A using a multilayer implant mask comprising a layer with a high lateral oxidation rate.

According to a some embodiments, the p+ implanted gate regions can be offset from the n+ source regions by using a multilayer implant mask consisting of one layer with high lateral oxidation rate at temperatures that will not significantly oxidize SiC (e.g. SiO₂/Si/SiO₂, SiO₂/Ge/SiO₂, SiO₂/poly-Si/SiO₂, SiN/Ge/SiN). The multilayer implant mask can be etched and oxidized using conditions which cause negligible oxide growth on SiC (e.g., <1000° C. in O₂). This method is illustrated in FIG. 7.

As set forth above, the p+ implant region can be offset from n+ source by using a self-aligned mask layer during ion implantation. Alternatively, the p+ implant region can be offset from n+ source by self-aligned recessing of the n+ source layer after ion implantation. In particular, the n+ region can be recessed after p+ implantation to remove the overlap of the n+ source and the p+ gate regions. The differential oxidation rates of SiC crystal can be used to laterally oxidize the n+ region preferentially to the p+ region. The (0001) surface of SiC oxidizes slowly compared to the other surfaces of SiC. Von Munch et al., *J. Electrochemical Soc.*, vol. 122, pg. 642 (1974). In addition, for the (1120) surface, the oxide thickness on n+ SiC was about twice the thickness on p-type SiC. These differential oxidation rates may be used to selectively oxidize the n+ source layer thus removing the p+/n+ overlap between gate and source.

Figure 8:
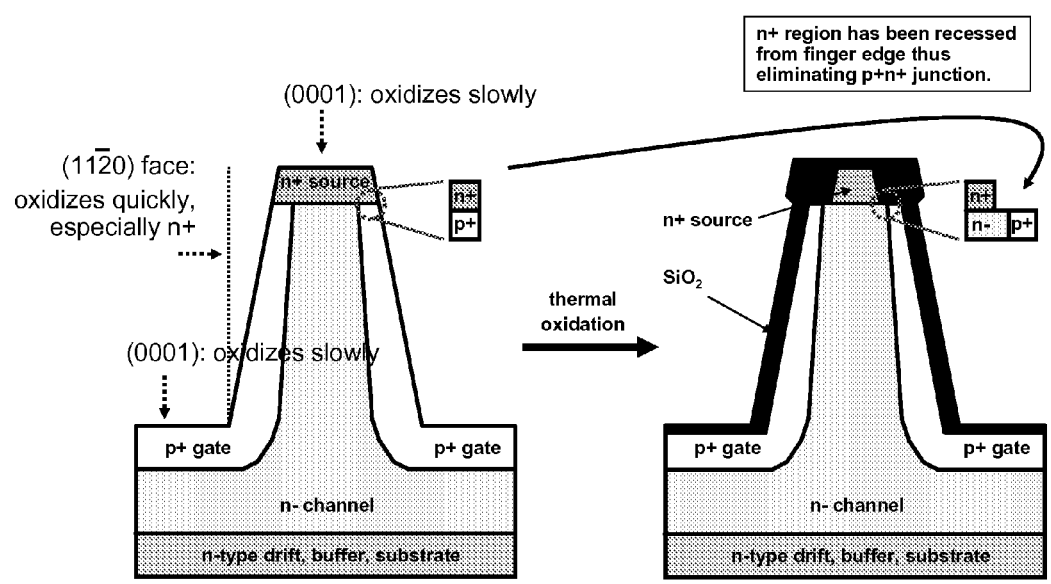
FIG. 8 is a schematic illustrating a method of making a device as set forth in FIG. 1A by recessing the n+ source layer by oxidation such that the n+ source layer does not contact the p+ implanted regions.

A method of offsetting the p+ implanted gate regions from the n+ source regions by the self-aligned recessing of the n+ source layer is shown in FIG. 8. As shown in FIG. 8, the (0001) surfaces of SiC oxidize slowly whereas the (1 1 2̄ 0) face oxidizes quickly, especially when the (1 1 2̄ 0) face is n+. As a result, the source is recessed from the edges of the sidewalls such that the n+ source regions no longer contact the p+ gate regions.

Figure 9:
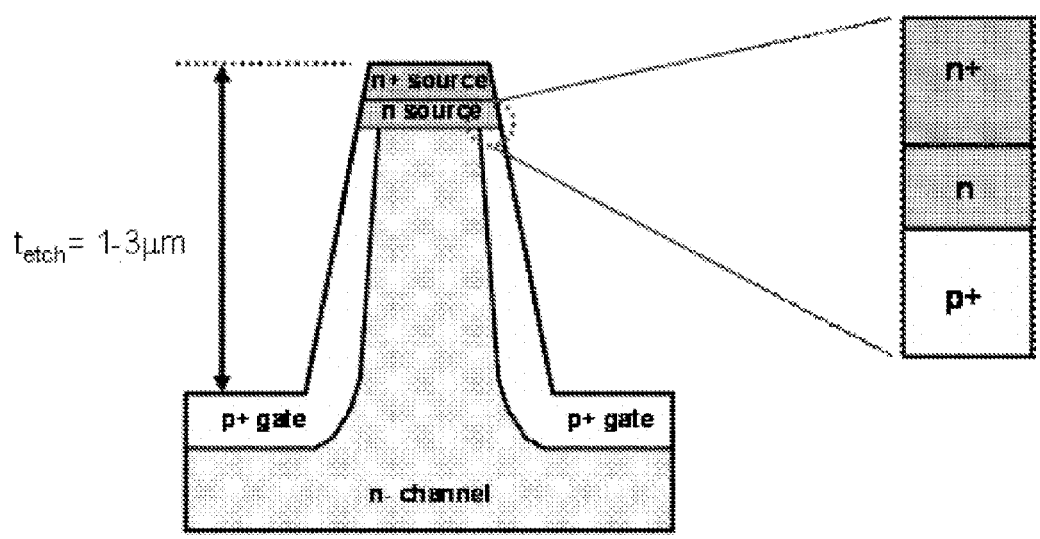
FIG. 9 is a schematic of a vertical junction field effect transistor having sloped sidewalls wherein the n+ source region is offset from the p+ implanted gate region by an n source region.

FIG. 9 is a schematic depicting an alternative embodiment wherein a non-uniformly doped source layer is used to offset the n+ source from the p+ implanted gate regions. As shown in FIG. 9, the source layer comprises a lower source layer in contact with the p+ gate regions adjacent an upper source layer with a higher doping concentration. The lower source layer create a pin junction with the gate regions whereas the higher doping in the upper layer can reduce contact resistance. The upper source layer can have a doping concentration of $1\times10^{19}$ to $1\times10^{20}$ cm$^{-3}$ and the lower source layer can have a doping concentration of less than $1\times10^{19}$ cm$^{-3}$. According to some embodiments, the thickness of each layer can be 0.25 μm. The thickness and doping concentration of the upper and lower source layers can be varied to obtain desirable operating characteristics.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] U.S. Patent Application Publication No. 2007/0187715 A1, "Power Junction Field Effect Power Transistor with Highly Vertical Channel and Uniform Channel Opening."
[2] U.S. Pat. No. 5,903,020, "Silicon Carbide Static Induction Transistor Structure."
[3] U.S. Pat. No. 7,479,672 B2, "Power Junction Field Effect Power Transistor With Highly Vertical Channel And Uniform Channel Opening."

What is claimed is:

1. A semiconductor device comprising:
    a substrate layer of a semiconductor material of a first conductivity type;
    a channel layer of a semiconductor material of the first conductivity type above an upper surface of the substrate layer, the channel layer comprising one or more raised regions extending upward from adjacent surfaces of the channel layer, the one or more raised regions each comprising an upper surface and first and second sidewalls, wherein the first and second sidewalls of the one or more raised regions taper inward to form an angle of at least 5° from vertical to the upper surface of the substrate layer, wherein the one or more raised regions each comprises implanted regions of a semiconductor material doped with dopants that impart, to the semiconductor material of the raised regions, conductivity of a second conductivity type different than the first conductivity type, wherein each of the implanted regions is adjacent to respective of the first and second sidewalls and extends beneath a respective of the adjacent surfaces of the channel layer to form a gate region; and
    a source layer of a semiconductor material of the first conductivity type on the upper surface of each of the one or more raised regions;
    wherein the implanted regions of the one or more raised regions are downwardly offset from respective of the source layers such that the dopants that impart conductivity of a second conductivity type are not implanted within the respective of the source layers.

2. The semiconductor device of claim 1, wherein each of the implanted regions of the one or more raised regions are offset from respective of the source layers by a region of semiconductor material of the first conductivity type having a doping concentration which is substantially the same as a doping concentration of an inner region of the one or more raised regions.

3. The semiconductor device of claim 1, wherein the source layer and the implanted regions of the one or more raised regions each have a doping concentration of at least $1\times10^{19}$ cm$^{-3}$.

4. The semiconductor device of claim 1, wherein the implanted regions of the one or more raised regions are offset from respective of the source layers by 0.5 μm or less.

5. The semiconductor device of claim 1, wherein:
each of the implanted regions of contacts the upper surface of the one or more raised regions;
the source layer is on an inner portion of the raised region; and
the device further comprises an oxide on the upper surface of the raised region adjacent the implanted regions of the one or more raised regions.

6. The semiconductor device of claim 1, wherein the first and second sidewalls adjacent the upper surfaces of the one or more raised regions are oriented at an angle of <5° from vertical to the upper surface of the substrate layer.

7. The semiconductor device of claim 1, wherein each of the first and second sidewalls taper inward and form an angle of at least 5° from vertical to the upper surface of the substrate layer for at least half of the distance between a lower surface of at least one of respective of the gate regions and the upper surface of respective of the one or more raised regions.

8. The semiconductor device of claim 1, wherein the vertical distance between a lower surface of the channel layer and each of the upper surfaces of the one or more raised regions is 0.5 to 5 μm and wherein the channel layer has a doping concentration of $1\times10^{16}$ to $1\times10^{18}$ cm$^{-3}$ outside the implanted regions.

9. The semiconductor device of claim 1, wherein the substrate has a thickness of 100 to 500 μm and a doping concentration of $1\times10^{19}$ to $5\times10^{19}$ cm$^{-3}$.

10. The semiconductor device of claim 1, wherein the source layer has a thickness of 0.1 to 1.0 μm and a doping concentration of $1\times10^{18}$ to $1\times10^{20}$ cm$^{-3}$.

11. The semiconductor device of claim 1, wherein the implanted regions of the one or more raised regions and the gate regions each have a doping concentration of $5\times10^{18}$ to $1\times10^{20}$ cm$^{-3}$.

12. The semiconductor device of claim 1, further comprising a drift layer of a semiconductor material of the first conductivity type between the substrate and the channel layer.

13. The semiconductor device of claim 12, wherein the drift layer has a thickness of 5 to 100 μm and a doping concentration of $1\times10^{14}$ to $2\times10^{16}$ cm$^{-3}$.

14. The semiconductor device of claim 1, further comprising a buffer layer between the substrate and the channel layer.

15. The semiconductor device of claim 14, wherein the buffer layer has a thickness of 0.1 to 1 μm and a doping concentration of $5\times10^{17}$ to $5\times10^{18}$ cm$^{-3}$.

16. The semiconductor device of claim 1, wherein the device comprises a plurality of raised regions, wherein the plurality of raised regions are elongate and are arranged in spaced relationship as fingers.

17. The semiconductor device of claim 1, wherein:
the semiconductor material of the first conductivity type is an n-type semiconductor material;
the semiconductor material of the second conductivity type is a p-type semiconductor material; and
the dopants that impart conductivity of the second conductivity type comprise aluminum ions.

18. The semiconductor device of claim 1, wherein the semiconductor material is a wide band-gap semiconductor material.

19. The semiconductor device of claim 1, further comprising:
a first gate contact on a first of the adjacent surfaces of the channel layer;
a source contact on the source layer; and
a drain contact on a surface of the substrate layer opposite the channel layer.

20. A method comprising:
selectively implanting ions into a channel layer of a semiconductor material of a first conductivity type to form implanted gate regions doped with dopants that impart, to the semiconductor material semiconductor material, of a second conductivity type different than the first conductivity type, wherein the channel layer is above an upper surface of a substrate layer and wherein the channel layer comprises one or more raised regions extending upward from adjacent surfaces of the channel layer, the one or more raised regions each comprising an upper surface and first and second sidewalls, wherein the first and second sidewalls of the one or more raised regions taper inward to form an angle of at least 5° from vertical to the upper surface of the substrate layer, wherein a source region of a semiconductor material of the first conductivity type is on the upper surface of each of the one or more raised regions, each of the source regions comprising side surfaces adjacent the first and second sidewalls and an upper surface, wherein an implant mask is on the upper surface of the source regions during the implanting of the ions and the implanted gate regions are formed in the sidewalls and in the adjacent surfaces of the channel layer, wherein the implanted gate regions are downwardly offset from respective of the upper surfaces of the one or more raised regions so that the dopants that impart conductivity of a second conductivity type are not implanted within a respective source region; and
removing the implant mask.

* * * * *